United States Patent
Jo et al.

(10) Patent No.: US 8,828,795 B2
(45) Date of Patent: Sep. 9, 2014

(54) METHOD OF FABRICATING SEMICONDUCTOR PACKAGE HAVING SUBSTRATE WITH SOLDER BALL CONNECTIONS

(75) Inventors: Sang-Gui Jo, Seoul (KR); Ji-Yong Park, Yongin-si (KR); Kwangjin Bae, Suwon-si (KR); Soyoung Lim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 105 days.

(21) Appl. No.: 13/616,618

(22) Filed: Sep. 14, 2012

(65) Prior Publication Data

US 2013/0005092 A1  Jan. 3, 2013

Related U.S. Application Data

(62) Division of application No. 12/794,027, filed on Jun. 4, 2010, now Pat. No. 8,304,892.

(30) Foreign Application Priority Data

Jun. 10, 2009  (KR) .................. 10-2009-0051622

(51) Int. Cl.
  *H01L 21/60* (2006.01)
  *H01L 23/498* (2006.01)
  *H01L 23/00* (2006.01)

(52) U.S. Cl.
  CPC . *H01L 23/49838* (2013.01); *H01L 2924/15311* (2013.01); *H01L 2224/48091* (2013.01); *H01L 2924/1517* (2013.01); *H01L 2224/16* (2013.01); *H01L 2224/49173* (2013.01); *H01L 23/49816* (2013.01); *H01L 2224/48105* (2013.01); *H01L 24/48* (2013.01); *H01L 24/16* (2013.01); *H01L 2924/15153* (2013.01); *H01L 2224/48227* (2013.01); *H01L 24/49* (2013.01)
  USPC .................................. 438/106; 257/E21.506

(58) Field of Classification Search
  None
  See application file for complete search history.

(56) References Cited

U.S. PATENT DOCUMENTS

| | | | |
|---|---|---|---|
| 6,476,331 B1 | 11/2002 | Kim et al. | |
| 6,580,620 B1 * | 6/2003 | Kim .............................. | 361/784 |
| 7,071,027 B2 | 7/2006 | Seo | |
| 2002/0056561 A1 | 5/2002 | Yaguchi et al. | |
| 2003/0001285 A1 | 1/2003 | Shin et al. | |
| 2003/0082845 A1 | 5/2003 | Hoffman et al. | |
| 2006/0006480 A1 | 1/2006 | Shinozaki et al. | |

FOREIGN PATENT DOCUMENTS

| | | |
|---|---|---|
| JP | 10-261740 A | 9/1998 |
| KR | 10-2004-0069513 A | 8/2004 |
| KR | 10-2006-0133804 A | 12/2006 |

* cited by examiner

*Primary Examiner* — Wensing Kuo
(74) *Attorney, Agent, or Firm* — Lee & Morse, P.C.

(57) ABSTRACT

A semiconductor package includes a base substrate, a semiconductor chip mounted on the base substrate and including bonding pads, first and second connection terminals disposed adjacent to the semiconductor chip on the base substrate and electrically connected to the bonding pads, a first ball land disposed on the base substrate and electrically connected to the first connection terminal, a second ball land spaced apart from the connection terminals, the first ball land disposed between the second ball land and at least one of the first and second connection terminals, a first insulating layer covering the first ball land but exposing at least a part of the second ball land, and a first conductive wire extending onto the first insulating layer and connecting the second connection terminal to the second ball land.

8 Claims, 17 Drawing Sheets

METHOD OF FABRICATING SEMICONDUCTOR PACKAGE HAVING SUBSTRATE WITH SOLDER BALL CONNECTIONS

CROSS REFERENCE TO RELATED APPLICATION

This is a divisional application based on pending application Ser. No. 12/794,027, filed Jun. 4, 2010, the entire contents of which is hereby incorporated by reference.

BACKGROUND

1. Field

Embodiments relate to a semiconductor package and a method of fabricating the same.

2. Description of the Related Art

As electronic devices have become small and light, a high density and high quality mounting of a package, which is the core of electronic devices, have become important considerations. As compared to a conventional plastic package, a ball grid array (BGA) package has advantages of reducing a mounting region on a mother board and having excellent electronic characteristics.

While conventional plastic packages employ a lead frame, the BGA package employs a printed circuit board. Since external connection terminals such as solder balls can be formed on the entire surface, which is opposite to an adhesive surface of semiconductor chips, of the printed circuit board, the mother board has the advantage of a high mounting density.

The solder balls may be disposed as a lattice shape between the package substrate and the printed circuit board. These solder balls may not only electrically connect the semiconductor chip to the printed circuit board, but also physically combine the semiconductor chip to the printed circuit board.

SUMMARY

At least one of the features and advantages may be realized by providing a semiconductor package, including a base substrate, a semiconductor chip mounted on the base substrate and including bonding pads, first and second connection terminals disposed adjacent to the semiconductor chip on the base substrate and electrically connected to the bonding pads, a first ball land disposed on the base substrate and electrically connected to the first connection terminal, a second ball land spaced apart from the connection terminals, the first ball land disposed between the second ball land and at least one of the first and second connection terminals, a first insulating layer covering the first ball land but exposing at least a part of the second ball land, and a first conductive wire extending onto the first insulating layer and connecting the second connection terminal to the second ball land.

The first ball land may be in direct contact with the first connection terminal.

The semiconductor package may further include a third connection terminal spaced apart from the first and second connection terminals, a third ball land spaced apart from the first and second connection terminals, the first and second ball lands disposed between the third ball land and at least one of the first through third connection terminals, a second insulating layer covering the first insulating layer, the first conductive wire, and the second ball land but exposing a part of the third ball land, and a second conductive wire crossing the second insulating layer to connect the third connection terminal to the third ball land.

The semiconductor package may further include solder balls, the solder balls being in contact with the connection terminals by penetrating the base substrate.

The first insulating layer may have an elasticity of 20 MPa or less.

The bonding pads of the semiconductor chip may be in direct contact with the connection terminals.

A plurality of first ball lands may be located at a circumference of the semiconductor chip so as to be spaced apart from the semiconductor chip at a constant distance, and the first insulating layer may cover the first ball lands to connect the first ball lands to each other.

Another semiconductor chip may be mounted on the base substrate to form a multichip module that includes at least two semiconductor chips on the base substrate, connection terminals on the base substrate may be electrically connected to the other semiconductor chip, and ball lands on the base substrate may be electrically connected to the connection terminals that are electrically connected to the other semiconductor chip.

At least one of the features and advantages may also be realized by providing a method of fabricating a semiconductor package, the method including preparing a base substrate, the base substrate including a semiconductor chip mounting region, forming connection terminals and ball lands on the base substrate, the connection terminals being adjacent to the semiconductor chip mounting region and the ball lands being spaced apart from the semiconductor chip mounting region, forming an insulating layer that at least partially exposes a ball land, the insulating layer covering a ball land adjacent to the connection terminals, and forming a conductive wire that connects the ball land exposed by the insulting layer to one of the connection terminals.

The method may further include forming holes overlapped with the ball lands by punching the base substrate, and providing solder balls such that the solder balls are in contact with the ball lands through the holes.

The insulating layer may cover ball lands adjacent to the connection terminals, the insulating layer connecting the ball lands adjacent to the connection terminals to each other.

BRIEF DESCRIPTION OF THE DRAWINGS

The above and other features and advantages will become more apparent to those of skill in the art by describing in detail exemplary embodiments with reference to the attached drawings, in which.

DETAILED DESCRIPTION

Figure 1A:
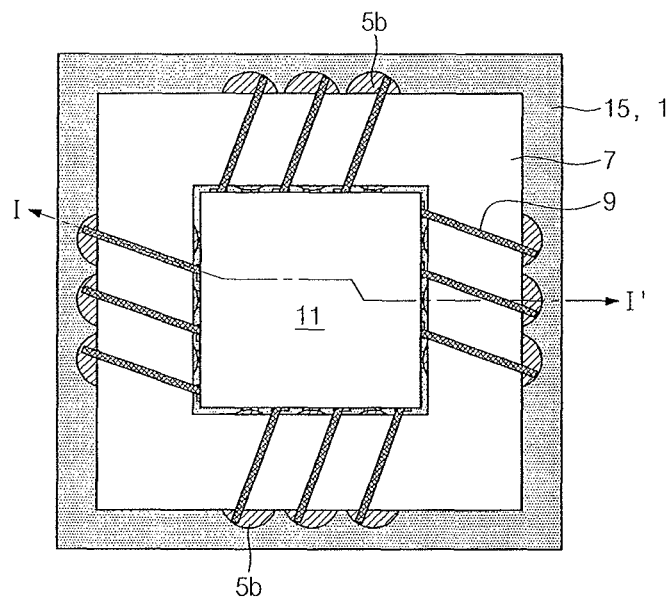
FIG. 1A illustrates a layout of a semiconductor package according to an embodiment.

Korean Patent Application No. 10-2009-0051622, filed on Jun. 10, 2009, in the Korean Intellectual Property Office, and entitled: "Semiconductor Package and Method of Fabricating the Same," is incorporated by reference herein in its entirety.

Advantages and features of the embodiments and methods of accomplishing the same may be understood more readily by reference to the following detailed description of preferred embodiments and the accompanying drawings. The embodiments may, however, be embodied in many different forms and should not be construed as being limited to the embodiments set forth herein. Rather, these embodiments are provided so that this disclosure will be thorough and complete and will fully convey the scope of the inventive concept to those skilled in the art, and the embodiments of the inventive concept will only be defined by the appended claims. In drawings, the thickness of layers and regions may be exaggerated for clarity. It will be understood that when a layer such as a conductive layer, a semiconductor layer, and an insulating layer is referred to as being "on" another material layer or board, it may be directly on the other material layer or board or intervening elements or layers may be present. Like reference numerals refer to like elements throughout the specification.

First Embodiment

Figure 1B:
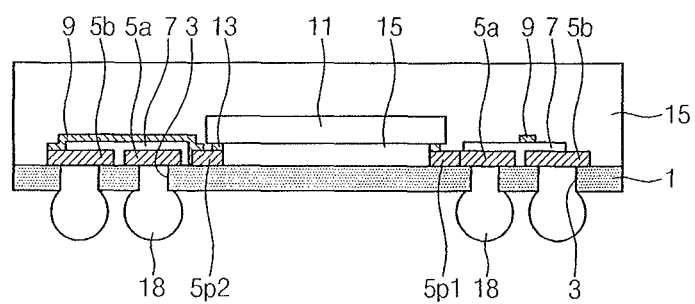
FIG. 1B illustrates a sectional view taken along the line I-I' of FIG. 1A.

FIG. 1A illustrates a layout of a semiconductor package according to an embodiment. FIG. 1B illustrates a sectional view taken along the line I-I' of FIG. 1A.

Referring to FIGS. 1A and 1B, a semiconductor chip 11 is disposed at a center of a base substrate 1 in a semiconductor package according to an embodiment. The base substrate 1 may be, for example, formed of polyimide-based or epoxy-based resin. A bonding pad 13 is located at an edge of the semiconductor chip 11. A plurality of connection terminals 5p1 and 5p2 may be disposed on the base substrate 1 corresponding to a position overlapped with the bonding pad 13 or a circumference of the bonding pad 13. The connection terminals 5p1 and 5p2 may be overlapped with the bonding pad 13. The connection terminals 5p1 and 5p2 may be made of conductive materials such as copper (Cu) and/or tin (Sn). The semiconductor chip 11 may be fixed onto the base substrate 1 in a flip-chip bonding manner, such that the bonding pad 13 comes in direct contact with the connection terminals 5p1 and 5p2. A plurality of holes 3 are disposed in the base substrate 1 adjacent to the connection terminals 5p1 and 5p2. Ball lands 5a and 5b are disposed on the base substrate 1 so as to be overlapped with the holes 3. The ball lands 5a and 5b may be formed of the same materials as those of the connection terminals 5p1 and 5p2. The ball lands include a first ball land 5a (adjacent to the semiconductor chip 11) and a second ball land 5b (spaced apart from the connection terminals 5p1 and 5p2 with the first ball land 5a interposed therebetween). The connection terminals include a first connection terminal 5p1 coming in contact with the first ball land 5a, and a second connection terminal 5p2 connected electrically to the second ball land 5b (see also FIG. 4A, which is discussed further below). The second connection terminal 5p2 is spaced apart from the first and second ball lands 5a and 5b. The first and second connection terminals 5p1 and 5p2 may be alternately disposed. According to this embodiment, the first ball land 5a may come in direct contact with the first connection terminal 5p1 and come in contact with the first connection terminal 5p1 by a conductive pattern interposed therebetween. A plurality of solder balls 18 come in contact with the ball lands 5a and 5b through the holes 3.

Subsequently, an insulating layer 7 is disposed to cover the first ball land 5a while exposing at least a part of the second ball land 5b. The insulating layer 7 covers the first ball lands 5a formed at the circumference of the semiconductor chip 11 to connect the first ball lands to each other. Generally, the insulating layer 7 may have a square form. The insulating layer 7 may be, for example, made of thermosetting insulation resins, and, preferably, may have a low elasticity. For example, the elasticity of the insulating layer 7 may be 20 MPa or less. The thermosetting insulation resin having low elasticity may be, for example, a silicon-based resin. A conductive wire 9, which is formed across the insulating layer 7, connects the second connection terminal 5p2 to the second ball land 5b while not coming in contact with the first ball land 5a. As a result, the conductive wire 9 is insulated from the first ball land 5a by the insulating layer 7. In addition, the insulating layer 7 may have an elasticity of 20 MPa or less. Thus, it may improve reliability in solder junction by absorbing a stress applied to the solder ball 18 when the semiconductor chip 11 is mounted on the base substrate 1. The conductive wire 9, the insulting layer 7, the second ball land 5b, the semiconductor chip 11, and the base substrate 1 are covered with a molding resin 15.

In the semiconductor package described with reference to FIGS. 1A and 1B, since the insulating layer 7 prevents the conductive wire 9 from coming in contact with an undesired ball land to avoid a short circuit of the conductive wire 9, it is easier to design the position of the conductive wire 9.

A process of fabricating the semiconductor package of FIGS. 1A and 1B will now be described.

FIGS. 2A, 3A, 4A, 5A, and 6A illustrate upper plan views of sequential stages in a processes of fabricating the semiconductor package of FIG. 1A; and FIGS. 2B, 3B, 4B, 5B, and 6B illustrate sectional views taken along the line I-I' of FIGS. 2A, 3A, 4A, 5A, and 6A, respectively.

Figure 2A:
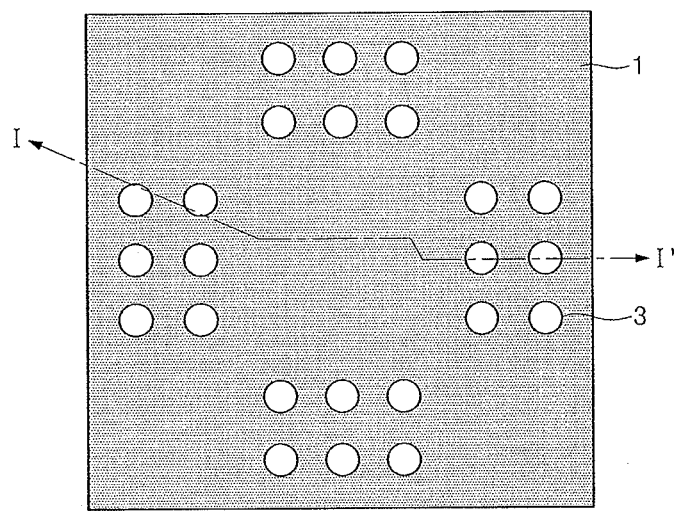
FIGS. 2A, 3A, 4A, 5A, and 6A illustrate upper plan views of sequential stages in a processes of fabricating the semiconductor package of FIG. 1A.
Figure 2B:
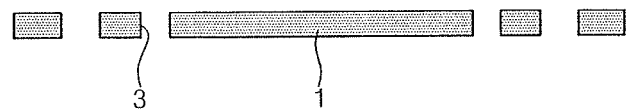
FIGS. 2B, 3B, 4B, 5B, and 6B illustrate sectional views taken along the line I-I' of FIGS. 2A, 3A, 4A, 5A, and 6A, respectively.

Referring to FIGS. 2A and 2B, the base substrate 1 is prepared. The base substrate 1 may be formed of, e.g., polyimide-based materials or epoxy resin-based materials. The plurality of holes 3 is formed by punching the base substrate 1. The holes 3 are formed at the circumference of the region on which the semiconductor chip is mounted. Although not illustrated in the drawings, an adhesive agent may be coated on an upper surface of the base substrate 1.

Figure 3A:
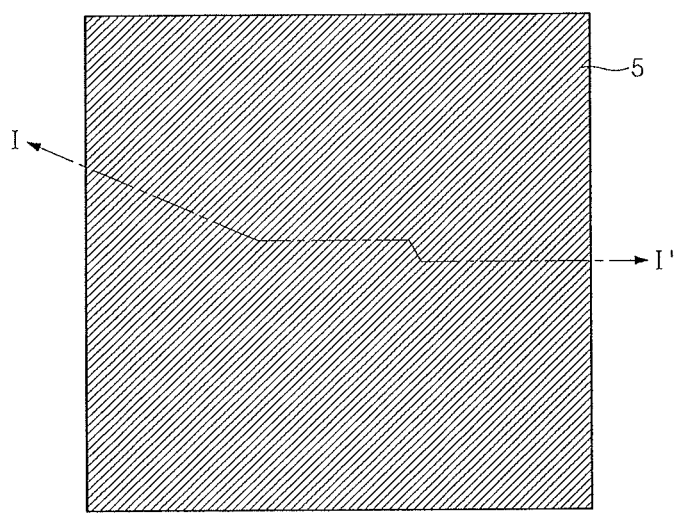
Figure 3B:
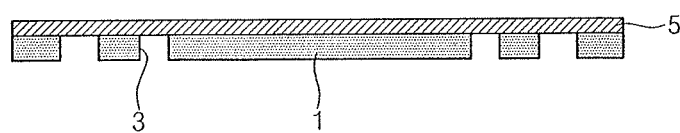

Referring to FIGS. 3A and 3B, a conductive layer 5 may be formed on the base substrate 1 having the holes 3 by a lamination process. For instance, the conductive layer may be a plate made of Cu and/or Sn that is attached onto the base substrate 1.

Figure 4A:
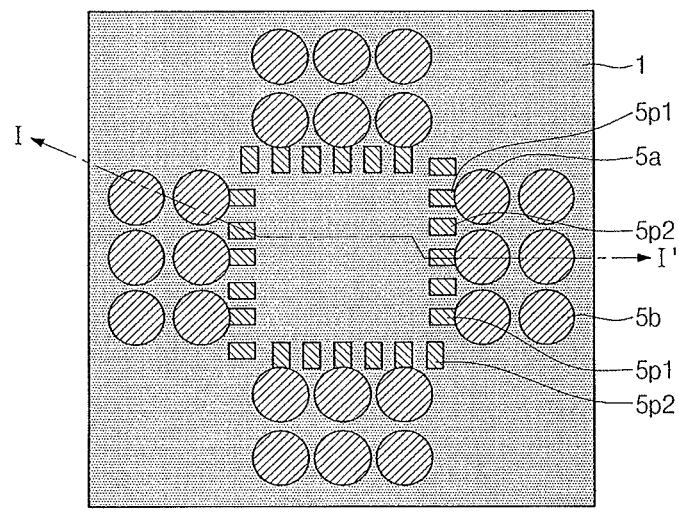
Figure 4B:
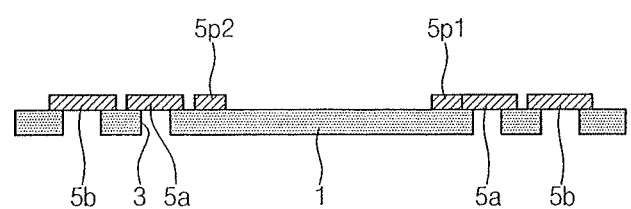

Referring to FIGS. 4A and 4B, a photoresist pattern is formed on the conductive layer 5 using a photolithography process. By patterning the conductive layer 5 using the photoresist pattern as an etching mask, the connection terminals $5p1$ and $5p2$ are formed at edges of the semiconductor chip mounting region, which is a center of the base substrate 1, and the first and second ball lands $5a$ and $5b$ are formed between the connection terminals and the edges of the base substrate 1. The first ball land $5a$ is adjacent to the connection terminals $5p1$ and $5p2$, and the second ball land $5b$ is adjacent to the edges of the base substrate 1. The first ball land $5a$ may come in direct contact with the first connection terminal $5p1$. The first connection terminal $5p1$ coming in contact with the first ball land $5a$ may be one pattern type electrically connected to the first ball land $5a$.

Figure 5A:
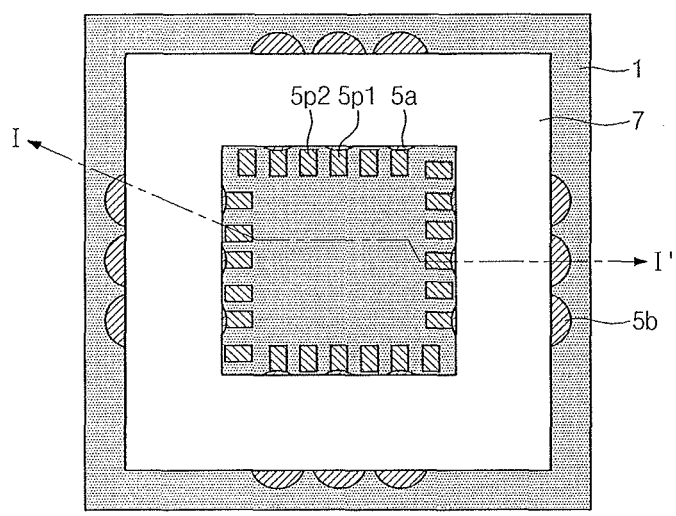
Figure 5B:
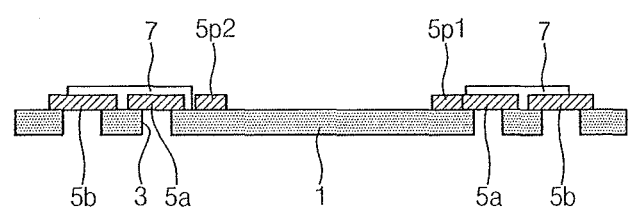

Referring to FIGS. 5A and 5B, the insulating layer 7 is formed to cover the first ball land $5a$ but expose at least a part of the second ball land $5b$, and both the connection terminals $5p1$ and $5p2$ and the semiconductor chip mounting region. The insulating layer 7 may be formed by a screen printing or ink jetting manner. The insulating layer 7 is formed so as to connect the first ball lands $5a$ to each other. The insulating layer 7 may be formed of thermosetting materials, insulation materials, and/or elastic materials.

Figure 6A:
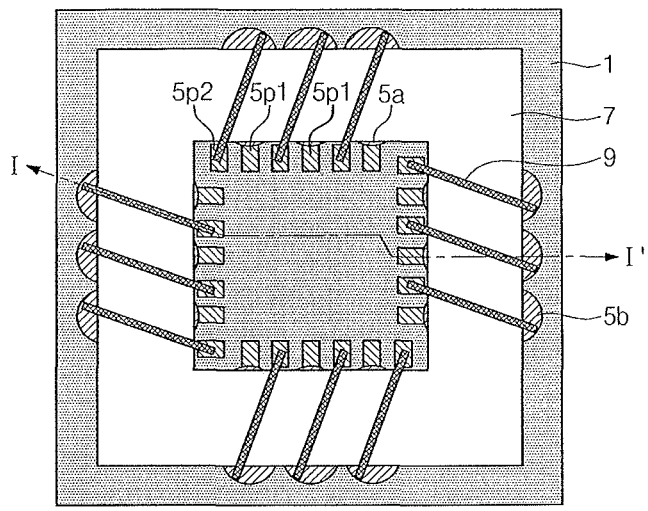
Figure 6B:
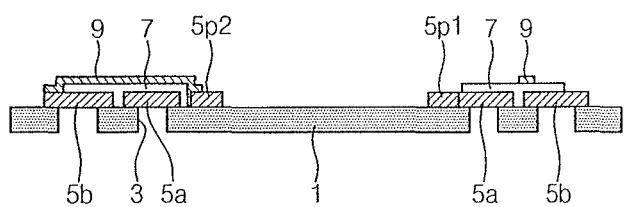

Referring to FIGS. 6A and 6B, the conductive wire 9 is formed to connect the second connection terminal $5p2$ to the second ball land $5b$ exposed by the insulating layer 7, while not coming in contact with the first ball land $5a$. Since the first ball lands $5a$ is covered with the insulating layer 7, no special provisions are needed for the conductive wire 9 to avoid the first ball land $5a$, thereby allowing free routing of the conductive wire 9. The conductive wire 9 may be formed of conductive materials by an ink jetting manner. Accordingly, the insulating layer 7 prevents the conductive wire 9 from coming in contact with the first ball land $5a$, thereby avoiding a short circuit of the conductive wire 9.

Referring to again FIGS. 1A and 1B, after the connection terminals are electrically connected to each of the ball lands $5a$ and $5b$, the semiconductor chip 11 is mounted on the base substrate 1. The semiconductor chip 11 may be mounted on the base substrate 1 in flip-chip bonding way, i.e., active side down. That is, the bonding pad 13 of the semiconductor chip 11 and the connection terminals $5p1$ and $5p2$ come in contact with each other and may be fused. Subsequently, the solder ball 18 is provided to the lower part of the base substrate 1. The upper surface of the base substrate 1 on which the semiconductor chip 11 is mounted is covered with the molding resin 15. The molding resin 15 may be, for example, formed of an epoxy molding compound resin, and may formed by a molding process and a baking process. The gap between the semiconductor chip 11 and the base substrate 1 may be filled with the molding resin 15. By the above-described processes, the semiconductor package of FIGS. 1A and 1B may be fabricated.

Second Embodiment

Figure 7A:
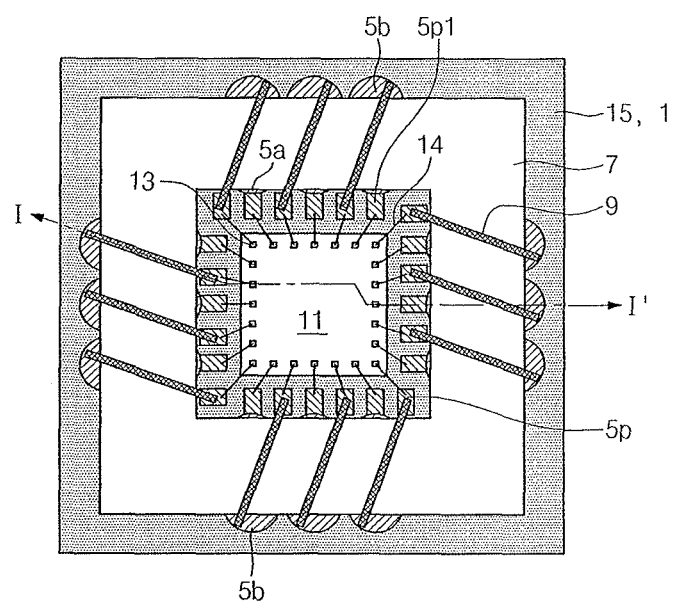
FIG. 7A illustrates a layout of a semiconductor package according to another embodiment.
Figure 7B:
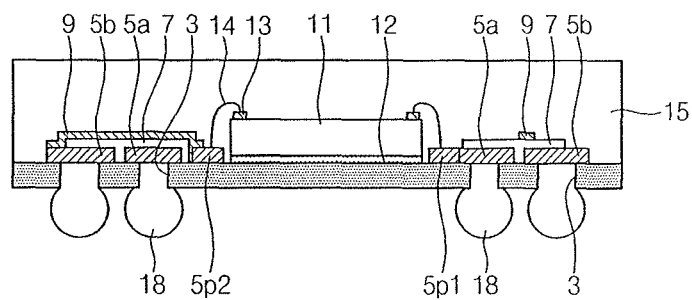
FIG. 7B illustrates a sectional view taken along the line I-I' of FIG. 7A.

The semiconductor chip 11 may be mounted on the base substrate 1 in a wire bonding way, i.e., active side up, as illustrated in FIGS. 7A and 7B. That is, the bonding pads 13 are located at the upper surface of the semiconductor chip 11, and the lower surface of the semiconductor chip 11, which is not provided with bonding pads 13, is attached onto the base substrate 1 by the adhesive agent 12. The bonding pads 13 are electrically connected to the connection terminals $5p1$ and $5p2$ through a wire 14. The remaining features and forming processes may be the same as those in the first embodiment.

Third Embodiment

Figure 8A:
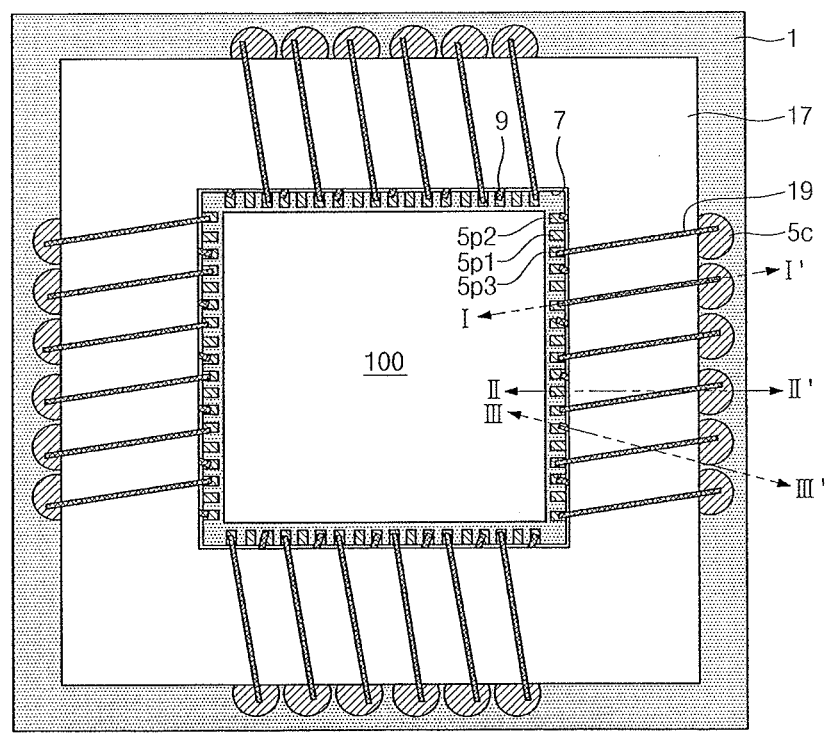
FIG. 8A illustrates a layout of a semiconductor package according to another embodiment.
Figure 8B:
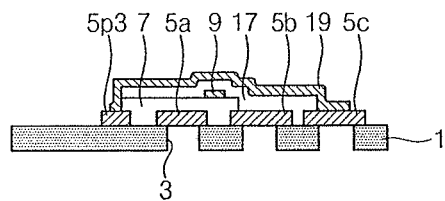
FIG. 8B illustrates a sectional view taken along the line I-I' of FIG. 8A.
Figure 8C:
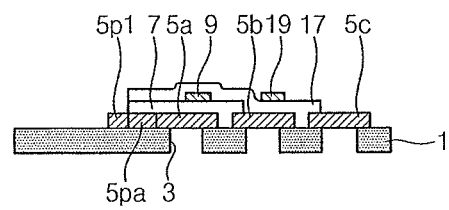
FIG. 8C illustrates a sectional view taken along the line II-II' of FIG. 8A.
Figure 8D:
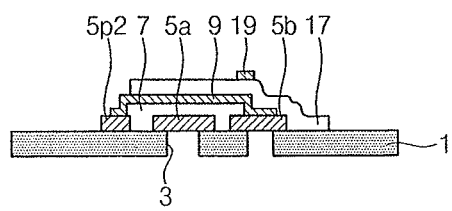
FIG. 8D illustrates a sectional view taken along the line III-III' of FIG. 8A.

FIG. 8A illustrates a layout of a semiconductor package according to another embodiment. FIG. 8B illustrates a sectional view taken along the line I-I' of FIG. 8A. FIG. 8C illustrates a sectional view taken along the line II-II' of FIG. 8A. FIG. 8D illustrates a sectional view taken along the line III-III' of FIG. 8A.

With reference to FIGS. 8A, 8B, 8C, and 8D, connection terminals $5p1$, $5p2$, and $5p3$ are disposed on the base substrate 1 so as to surround the circumference of a semiconductor chip mounting region 100. The first ball land $5a$, the second ball land $5b$, and a third ball land $5c$ are disposed outwardly from the connection terminals $5p1$, $5p2$, and $5p3$, respectively. Holes 3 are disposed in the base substrate 1 so as to correspond to each of the ball lands $5a$, $5b$, and $5c$. The connection terminals include the first connection terminal $5p1$ electrically connected to the first ball land $5a$, the second connection terminal $5p2$ electrically connected to the second ball land $5b$, and the third connection terminal $5p3$ electrically connected to the third ball land $5c$. The first connection terminal $5p1$ is electrically connected to the first ball land $5a$ through a lower conductive wire Spa. The materials of the ball lands $5a$, $5b$, and $5c$ may be the same as those of the lower conductive wire Spa. The first ball land $5a$ is covered with a first insulating layer 7. The first insulating layer 7 covers the adjacent first ball lands $5a$ such that the adjacent first ball lands $5a$ are connected to each other. The second connection terminal $5p2$, which is not electrically connected to the first ball land $5a$, is electrically connected to the second ball land $5b$ through a first conductive wire 9. The first conductive wire 9, the first insulating layer 7, and the second ball land $5b$ are covered with a second insulating layer 17. The third connection terminal $5p3$, which is not electrically connected to the first and second ball lands $5a$ and $5b$, is electrically connected to the third ball land $5c$ through a second conductive wire 19.

Although not illustrated in FIGS. 8A, 8B, 8C, and 8D, solder balls may be disposed to come in contact with the ball lands $5a$, $5b$, and $5c$ through the holes 3, and the semiconductor chip may be mounted on the semiconductor chip mounting region 100 in the flip-chip bonding manner or the wire bonding manner.

Figure 9A:
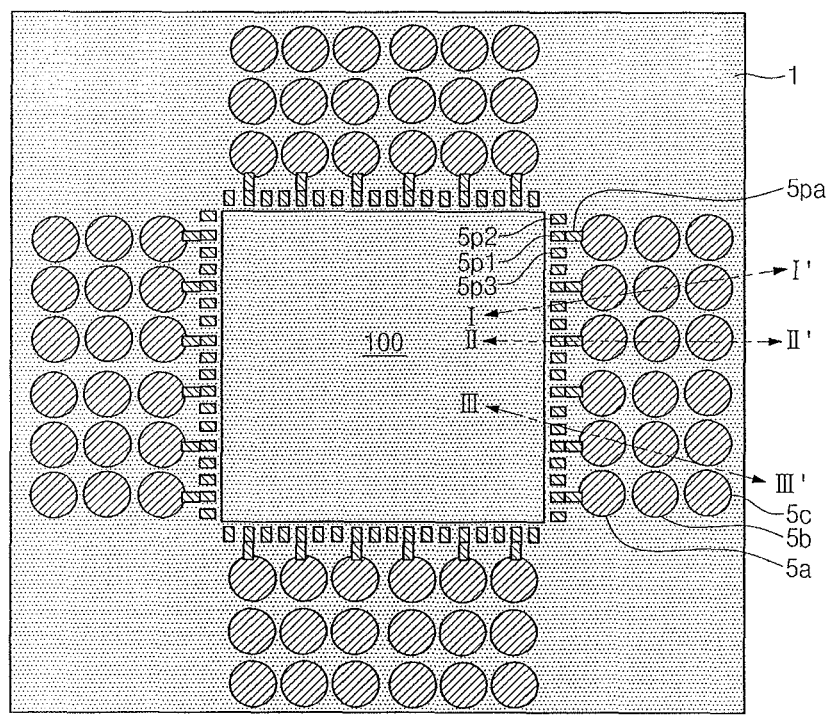
FIGS. 9A and 10A illustrate upper plan views of sequential stages in a processes of fabricating the semiconductor package of FIG. 8A.
Figure 9B:
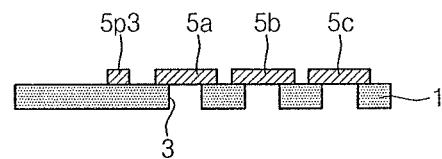
FIGS. 9B and 10B illustrate sectional views taken along the line I-I' of FIGS. 9A and 10A, respectively.
Figure 9C:
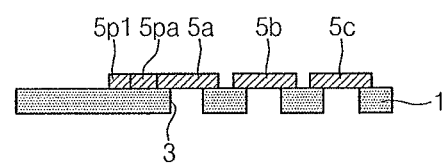
FIGS. 9C and 10C illustrate sectional view taken along the line II-II' of FIGS. 9A and 10A, respectively.
Figure 9D:
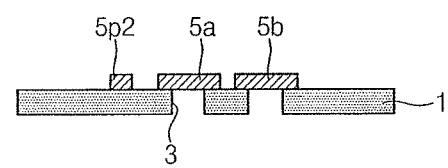
FIGS. 9D and 10D illustrate sectional view taken along the line III-III' of FIGS. 9A and 10A, respectively.
Figure 10A:
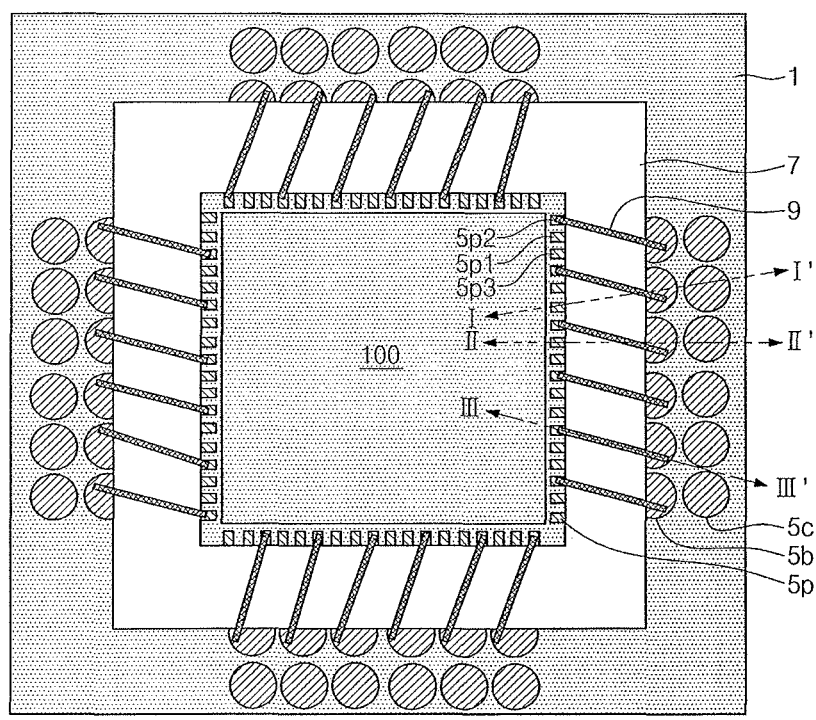
Figure 10B:
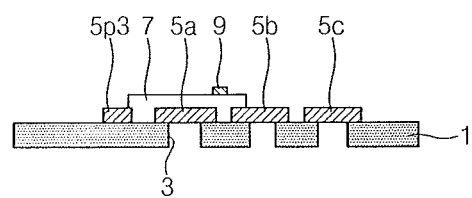
Figure 10C:
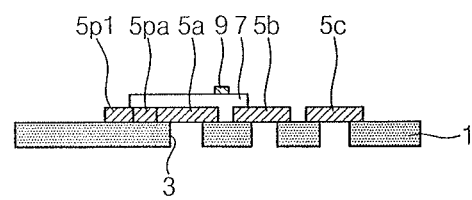
Figure 10D:
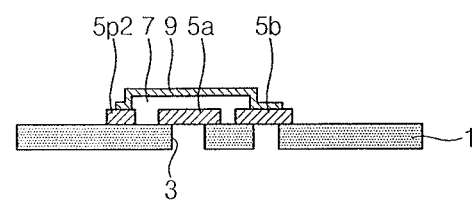

A process of forming the semiconductor package according to this embodiment will now be described with reference to FIGS. 9A through 9D and 10A through 10D. FIGS. 9A and 10A illustrate upper plan views of sequential stages in a processes of fabricating the semiconductor package of FIG. 8A. FIGS. 9B and 10B illustrate sectional views taken along the line I-I' of FIGS. 9A and 10A, respectively. FIGS. 9C and 10C illustrate sectional view taken along the line II-II' of FIGS. 9A and 10A, respectively. FIGS. 9D and 10$d$ illustrate sectional view taken along the line III-III' of FIGS. 9A and 10A, respectively.

Referring to FIGS. 9A through 9D, a plurality of holes 3 are formed by punching the semiconductor chip mounting region 100 on the base substrate 1. Subsequently, a conductive plate is attached onto the base substrate 1, and resist patterns are then formed on the base substrate 1 by performing a photolithography process on the conductive plate. By etching the conductive plate using the resist patterns as an etching mask, the first through third connection terminals $5p1$, $5p2$, and $5p3$, the first ball land $5a$, the second ball land $5b$, the third ball land $5c$, and the lower conductive wire Spa connecting the first connection terminal $5p1$ to the first ball land $5a$ are formed in the vicinity of the semiconductor chip mounting region 100.

Referring to FIGS. 10A through 10D, the first insulating layer 7 is formed to cover the first ball land 5a, while exposing at least a part of the second ball land 5b, the semiconductor chip mounting region, and the connection terminals 5p1, 5p2, and 5p3. The first conductive wire 9 is formed on the first insulating layer 7 in the ink jetting manner to connect the second connection terminal 5p2 to the second ball land 5b.

Referring to again FIGS. 8A and 8B, the second insulating layer 17 is then formed to cover the first insulating layer 7 and the second ball land 5b, while exposing at least a part of the third ball land 5c. The second conductive wire 19 is formed across the second insulating layer 17 to connect the third connection terminal 5p3 to the third ball land 5c.

The semiconductor chip is mounted on the semiconductor chip mounting region 100 in the flip-chip bonding manner or the wire bonding manner. The solder balls are provided in the holes 3, and the upper surface of the base substrate 1 is covered with the molding resin. The remaining features and forming processes may be the same to those in the first and second embodiments.

As just described, it is possible to prevent a short circuit of the conductive wires using the insulating layer even with several ball lands of the connection terminals. The first insulating 7 and the second insulating layer 17 prevent a short circuit between the first ball land 5a, the second ball land 5b, and the third ball land 5c spaced apart from the semiconductor chip mounting region 100 by a first distance, a second distance, and third distance, respectively. Three or more insulating layers may be used for preventing the short circuit between ball lands more distant from the semiconductor chip mounting region, without being limited to only two insulating layers.

In addition, one insulating layer not covers the ball land spaced apart from the semiconductor chip mounting region by a predetermined distance but may cover the ball lands disposed at two or more circumferences. That is, one first insulating layer may cover the ball lands spaced apart from the semiconductor chip mounting region by the first distance and the second distance and may then cover the ball lands spaced apart from the semiconductor chip mounting region by the third distance and the fourth distance.

Fourth Embodiment

A process of applying the technique of the semiconductor package to a multi-chip module will now be described with reference to FIG. 11.

Figure 11:
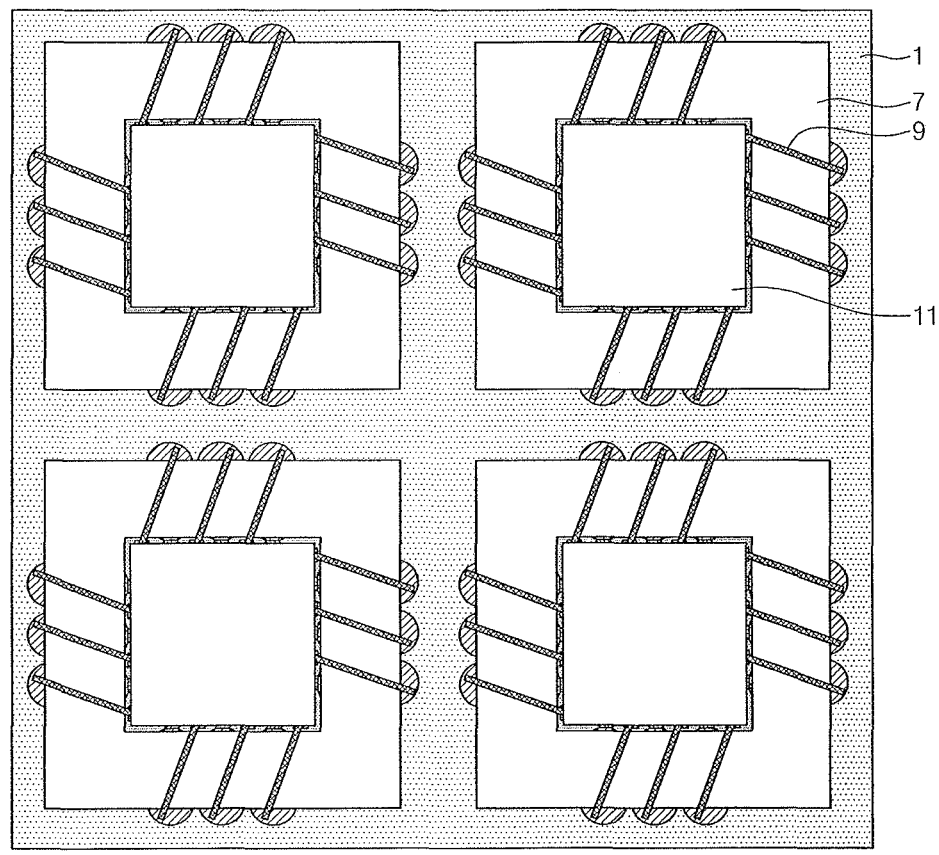
FIG. 11 illustrates an upper plan view of a semiconductor package according to another embodiment.

Referring to FIG. 11, a plurality of semiconductor chips, e.g., four, may be mounted on one base substrate 1 to form the multi-chip module. The semiconductor chips may be mounted on the base substrate 1 in the manner described above with reference to FIG. 1A. That is, the configuration of the multi-chip module may be the same as in the first embodiment, except that a plurality of semiconductor chips, e.g., four semiconductor chips, may be mounted on one base substrate 1.

The technology of the semiconductor package may be applied to various semiconductor devices and package modules including the same.

Figure 12:
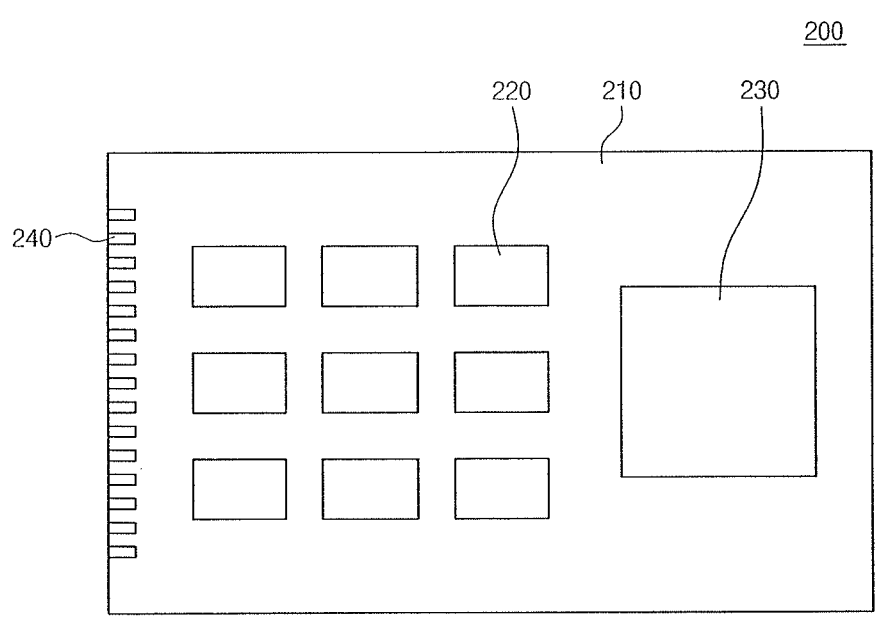
FIG. 12 illustrates an example of a package module including a semiconductor package according to an embodiment.

FIG. 12 illustrates an example of a package module including a semiconductor package according to an embodiment. Referring to FIG. 12, a package module 200 may be provided in the form of a semiconductor integrated circuit chip 220 and a semiconductor integrated circuit chip 230 in which a QFP (Quad Flat Package) is packaged. The package module 200 may be formed by installing the semiconductor devices 220 and 230, to which the technology of the semiconductor package according to an embodiment is applied, on a board 210. The package module 200 may be connected to an external electronic device through an external connection terminal 240 provided on one side of the board 210.

Figure 13:
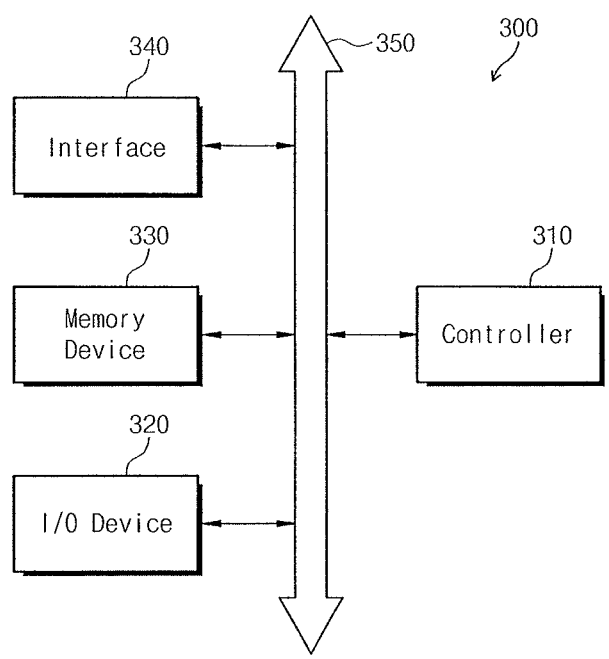
FIG. 13 illustrates a block diagram of an example of an electronic device including a semiconductor package according to an embodiment.

The above-described technology of a semiconductor package may be applied to an electronic system. FIG. 13 illustrates a block diagram of an example of an electronic device including a semiconductor package according to an embodiment. Referring to FIG. 13, an electronic system 300 may include a controller 310, an input/output (I/O) device 320, and a memory device 330. The controller 310, the I/O device 320, and the memory device 330 may be connected to each other through a bus 350. The bus 350 is a transfer path for data. For example, the controller 310 may include at least one of a microprocessor, a digital signal processor, and a microcontroller, or at least one logic device capable of performing the same functions as them. The controller 310 and the memory device 330 may include semiconductor packages according to embodiment. The I/O device 320 may include at least one of a keypad, a keyboard, a display device, and the like. The memory device 330 may store data. The memory device 330 may store data and/or commands executed by the controller 310. The memory device 330 may include a volatile memory device and/or a nonvolatile memory device. The memory device 330 may include a flash memory. For example, the flash memory may be mounted in an information processing system such as a mobile unit or a desktop computer. The flash memory may be constituted by a SSD (solid state disk). In this case, the electronic system 300 is capable of reliably storing a mass of data in the flash memory system. The electronic system 300 may further include an interface 340 for transmitting data to a communication network or receiving data from the communication network. The interface 340 may be in the form of a wire/wireless interface. For example, the interface 340 may include an antenna or a wire/wireless transceiver. In addition, although not illustrated in the drawings, the electronic system 300 may further include, e.g., an application chipset, a CIS (camera image processor), and an input-output device.

The electronic system 300 may be realized by a mobile system, a personal computer, an industrial computer, or a logical system for performing various functions. For example, the mobile system may be a PDA (personal digital assistant), a portable computer, a web tablet, a mobile phone, a wireless phone, a laptop computer, a memory card, a digital music system, or an information transmitting/receiving system. In the case where the electronic system 300 is an equipment capable of performing a wireless communication, the electronic system 300 may be used via a communication interface protocol of a third generation communication system, such as CDMA, GSM, NADC, E-TDMA, WCDAM, or CDMA2000.

Figure 14:
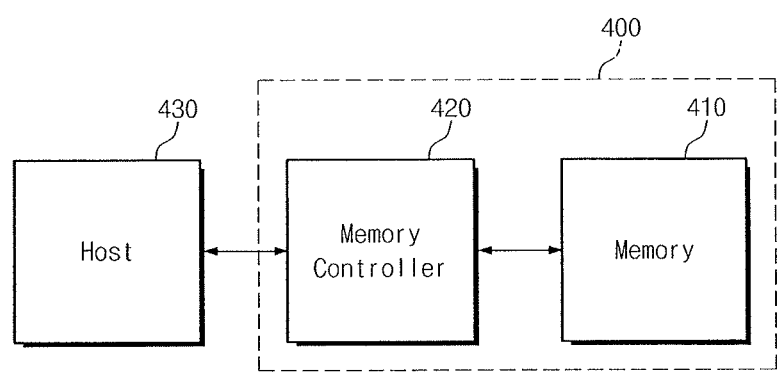
FIG. 14 illustrates a block diagram of an example of a memory system including a semiconductor package according to an embodiment.

The semiconductor package according to an embodiment may be provided as a memory card. FIG. 14 illustrates a block diagram of an example of a memory system including the semiconductor package according to an embodiment. Referring to FIG. 14, a memory card 400 may include a nonvolatile memory device 410 and a memory controller 420. The nonvolatile memory device 410 and the memory controller 420 are capable of storing data or reading stored data. The nonvolatile memory device 410 may include a nonvolatile memory device to which the semiconductor package according to an embodiment is applied. The memory controller 420 may control the flash memory device 410 so as to read stored data or store data in response to the reading/writing request of the host.

As describe above, embodiments may provide a semiconductor package that can improve reliability. Further, embodiments may also provide a method of fabricating a semiconductor package that can prevent an electrical short circuit between conductive wires, which may be advantageous on, e.g., a restricted area of a single-layered printed circuit board.

Solder balls of a general semiconductor package may be easily damaged by changes in temperature and physical external impacts. For example, when an physical external impact such as board bending is applied to the board, cracks may occur in the solder balls due to the physical external impact. Further, circuits formed on the connection pad and board may be removed, i.e., lifted, from the surface of the board due to the separation of the solder balls. Accordingly, electric signals may not be transferred between the semiconductor chip and the board through the solder balls, and the solder joint reliability of the solder balls may be deteriorated.

In a case of a multilayered printed circuit board, conductive patterns may be formed on each layer of the printed circuit board, and photolithography processes may be used for this. Moreover, a via may be formed in each layer of the printed circuit board so as to connect the conductive patterns to one another.

Embodiments may provide a more economic and simple process than a multilayered printed circuit board. Further, in the semiconductor package according to an embodiment, since the insulating layer is located at a lower part of the conductive wire that connects the ball lands spaced apart from the connection terminal to each other, the conductive wire does not come in contact with other ball lands. Accordingly, it can prevent the undesired short circuit of the conductive wire. In addition, when the package is mounted on the mother board or undergoes a change in temperature, the insulating layer plays a role in buffering the ball land on the solder ball, thereby improving the reliability of the solder ball.

Exemplary embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A method of fabricating a semiconductor package, the method comprising:
    preparing a base substrate, the base substrate including a semiconductor chip mounting region;
    forming a first connection terminal, a second connection terminal, and a third connection terminal on the base substrate, the first, second, and third connection terminals being adjacent to the semiconductor chip mounting region and being spaced apart from each other;
    forming a first ball land on the base substrate and electrically connected to the first connection terminal;
    forming a second ball land spaced apart from the first connection terminal, the first ball land disposed between the second ball land and at least one of the first through third connection terminals;
    forming a third ball land spaced apart from the first and second connection terminals, the first and second ball lands disposed between the third ball land and at least one of the first through third connection terminals;
    forming an insulating layer that at least partially exposes at least one ball land out of the ball lands, the insulating layer covering at least another ball land adjacent to the connection terminals out of the ball lands; and
    forming a conductive wire that connects the at least one ball land exposed by the insulting layer to one of the connection terminals.

2. The method as claimed in claim 1, further comprising:
    forming holes overlapped with the ball lands by punching the base substrate; and
    providing solder balls such that the solder balls are in contact with the ball lands through the holes.

3. The method as claimed in claim 1, wherein the first ball land includes a plurality of first ball lands that are located at a circumference of the semiconductor chip mounting region, and
    the insulating layer covers the plurality of first ball lands to connect the plurality of first ball lands to each other.

4. The method as claimed in claim 1, wherein the first ball land is in direct contact with the first connection terminal.

5. The method as claimed in claim 1, wherein the first insulating layer has an elasticity of 20 MPa or less.

6. The method as claimed in claim 1, further comprising:
    preparing a semiconductor chip including bonding pads; and
    mounting the semiconductor chip to the semiconductor chip mounting region by connecting the bonding pads to the connection terminals.

7. The method as claimed in claim 6, wherein the semiconductor chip is connected to the semiconductor chip mounting region by flip chip bonding.

8. The method as claimed in claim 1, wherein
    the semiconductor chip mounting region includes a plurality of semiconductor chip mounting regions, and the plurality of semiconductor chips are mounted to the plurality of semiconductor chip mounting regions, respectively.

* * * * *